(12) United States Patent
Plagens et al.

(10) Patent No.: US 8,040,139 B2
(45) Date of Patent: Oct. 18, 2011

(54) FAULT DETECTION METHOD FOR DETECTING LEAKAGE PATHS BETWEEN POWER SOURCES AND CHASSIS

(75) Inventors: Mark Plagens, Richardson, TX (US); Brian Fritz, Frisco, TX (US)

(73) Assignee: Maxim Integrated Products, Inc., Sunnyvale, CA (US)

( * ) Notice: Subject to any disclaimer, the term of this patent is extended or adjusted under 35 U.S.C. 154(b) by 210 days.

(21) Appl. No.: 12/403,235

(22) Filed: Mar. 12, 2009

(65) Prior Publication Data

US 2010/0207635 A1    Aug. 19, 2010

Related U.S. Application Data

(60) Provisional application No. 61/152,905, filed on Feb. 16, 2009.

(51) Int. Cl.
*G01R 31/08* (2006.01)
(52) U.S. Cl. .................. 324/509; 324/557; 324/551
(58) Field of Classification Search .................. 324/509, 324/551, 557, 522, 525
See application file for complete search history.

(56) References Cited

U.S. PATENT DOCUMENTS

| | | | |
|---|---|---|---|
| 3,696,367 A | 10/1972 | Inamdar | |
| 3,700,966 A | 10/1972 | Morrow | |
| 3,754,221 A | 8/1973 | Stelter | |
| 3,786,466 A | 1/1974 | Naito et al. | |
| 3,801,898 A | 4/1974 | Young | |
| 3,947,759 A | 3/1976 | Briggs | |
| 4,002,968 A | 1/1977 | Reid | |
| 4,151,460 A | 4/1979 | Seese et al. | |
| 4,206,398 A | 6/1980 | Janning | |
| 4,253,056 A | 2/1981 | Chaudhary | |
| 4,417,202 A | 11/1983 | Pascoe | |
| 4,472,676 A | 9/1984 | Eichmann et al. | |
| 4,638,245 A | 1/1987 | MacPhee et al. | |
| 4,679,111 A | 7/1987 | Koch et al. | |
| 4,809,123 A | 2/1989 | Allington et al. | |
| 4,896,115 A | 1/1990 | Lemaitre et al. | |
| 4,929,901 A | 5/1990 | Kimball et al. | |
| 5,101,160 A | 3/1992 | Barjonnet et al. | |
| 5,146,397 A | 9/1992 | Fruhling | |
| 5,382,946 A | 1/1995 | Gale | |
| 5,481,194 A | 1/1996 | Schantz et al. | |

(Continued)

OTHER PUBLICATIONS

European Search Report for European Patent Application No. 10001540.3-1524 (counterpart application); Jul. 1, 2010; 4 pgs.

*Primary Examiner* — Vincent Q Nguyen
(74) *Attorney, Agent, or Firm* — Howison & Arnott, L.L.P.

(57) ABSTRACT

A method of detecting a ground fault condition between a direct current power system and the chassis ground of an electric or hybrid-electric vehicle is provided. The method includes sequentially opening and closing a first switch connected between a positive node of the direct current power system and the chassis ground of the vehicle and a second switch connected between a negative node of direct current power system and the chassis ground. The sequential opening and closing of the first and second switches charges and discharges an inherent capacitance present between the metal components of the direct current power system and the chassis. First and second currents are created as the inherent capacitance is charged and discharged. Measurements of the created first and second currents are then used to determine whether a ground fault condition exists between the direct current power system and the vehicle chassis ground.

19 Claims, 4 Drawing Sheets

U.S. PATENT DOCUMENTS

| | | |
|---|---|---|
| 5,508,872 A | 4/1996 | Khoo et al. |
| 5,510,725 A | 4/1996 | Schantz, Jr. et al. |
| 5,530,360 A | 6/1996 | Kerchaert et al. |
| 5,561,380 A | 10/1996 | Sway-Tin et al. |
| 5,686,839 A | 11/1997 | Takagi |
| 5,712,572 A | 1/1998 | Tamechika et al. |
| 5,760,488 A | 6/1998 | Sonntag |
| 5,811,976 A | 9/1998 | Fischer |
| 5,990,685 A | 11/1999 | Nightall |
| 6,084,755 A | 7/2000 | Roberts et al. |
| 6,320,389 B1 | 11/2001 | Tamesue et al. |
| 6,678,132 B1 | 1/2004 | Carruthers et al. |
| 6,794,879 B2 | 9/2004 | Lawson et al. |
| 6,833,708 B2 | 12/2004 | Furukawa |
| 6,856,137 B2 | 2/2005 | Roden et al. |
| 6,919,726 B2 | 7/2005 | Yudahira |
| 6,970,807 B2 | 11/2005 | Kito et al. |
| 6,998,819 B2 | 2/2006 | Jin |
| 7,026,788 B2 | 4/2006 | Yano et al. |
| 7,049,825 B2 | 5/2006 | Carruthers |
| 7,075,311 B1 | 7/2006 | Oshiro et al. |
| 7,102,356 B2 | 9/2006 | Wild |
| 7,560,935 B2 * | 7/2009 | Morimoto ............... 324/525 |
| 7,629,794 B2 | 12/2009 | Kamata |
| 2007/0285057 A1 | 12/2007 | Yano |
| 2009/0184718 A1 | 7/2009 | Ivan et al. |
| 2009/0228163 A1 | 9/2009 | Tarchinski |
| 2009/0278547 A1 * | 11/2009 | Acena et al. ............. 324/509 |

* cited by examiner

FAULT DETECTION METHOD FOR DETECTING LEAKAGE PATHS BETWEEN POWER SOURCES AND CHASSIS

CROSS-REFERENCE TO RELATED APPLICATIONS

This application claims the benefit of U.S. Provisional Application No. 61/152,905, filed on Feb. 16, 2009, and entitled FAULT DETECTION METHOD FOR DETECTING LEAKAGE PATHS BETWEEN POWER SOURCES AND CHASSIS, the specification of which is incorporated herein by reference.

TECHNICAL FIELD

The following disclosure relates to electrical fault detection systems and methods for high voltage DC systems.

BACKGROUND

A number of factors including ever-increasing energy costs, environmental concerns and the development of new battery technology has fueled interest in electrically powered automobiles. "Plug-in" type electric vehicles rely solely on a battery powered electric motor to propel the vehicle. "Hybrid" vehicles use a combination of an electric drive motor in combination with a gasoline or diesel fueled engine to achieve higher mileage.

Plug-in and hybrid vehicles typically use a high voltage DC drive powered with large batteries or battery packs. Voltages present in these systems may range from 100 to 1000 or greater. Consequently, the use of such systems can present a danger if the high voltage system is not effectively isolated from the vehicle chassis. The threshold voltage where DC becomes dangerous can be as low as 55 to 60 volts and contact with a high voltage DC source can cause serious injuries. Contact with direct current tends to cause continuous muscular contractions that make the victim hold on to a live conductor, increasing the risk of burns and other injuries. Current leakage from the high voltage system to the chassis (a fault) may result from frayed wires contacting chassis components and component failure. Corrosion and/or infiltration of salt, dirt and other debris may provide a current path. Consequently it is important to identify potentially dangerous faults.

One presently proposed fault detectors utilizes a capacitively coupled signal injected into an isolated ground. However, large amounts of parasitic and inherent capacitance in electrically powered vehicles tend to make such devices too "noisy" for reliable use of a capacitively coupled signal for fault detection. Another proposed approach is the use of a wheatstone bridge. However, a short across the detection nodes of a wheatstone bridge may be undetectable. Thus, there exists a need for a more reliable fault detection system for use with high voltage DC systems such as those used in electric vehicles and other applications.

SUMMARY

In one embodiment, an apparatus for monitoring a direct current system for ground faults in a device having inherent capacitance between the direct current system and a chassis ground is provided. This embodiment includes a fault detection module connected between the chassis ground and a first switch and a second switch. The first switch is also connected between a positive node of the direct current system and the fault detection module. The second switch is connected between a negative node of the direct current system and the fault detection module. A switch driver is provided to sequentially open and close the first and second switches such that the inherent capacitance is charged and discharged.

In one aspect, the fault detection module includes a controller for controlling the switch driver and a current sensor. The current sensor senses a first current when the first switch is closed and a second current when the second switch is closed. The current sensor then transmits a signal to the controller indicating an amperage or measurement of the first and second currents. A data interface connected to the controller outputs a signal in response to the amperage or measurement of the first and second currents. The current sensor may include a programmable gain amplifier and an analog to digital signal converter wherein the programmable gain amplifier transmits a signal to the analog to digital signal converter and the analog to digital signal converter transmits a signal to the controller.

In another aspect, a first resistor is connected in series between the positive node of the direct current system and the first switch. And, a second resistor is connected between the negative node of the direct current system and the second switch. Preferably, the resistances of the first and second resistors are substantially equal. The resistances of the first and second resistors is typically high, on the order of a mega ohm.

The apparatus may include a non-volatile memory connected to the controller, with preprogrammed instructions that are utilized by the controller for detecting a fault based on changes in the first and second currents. The non-volatile memory may also include or be programmed to include instructions, utilized by the controller, for determining a parasitic resistance of the direct current system signal in response to changes in the first and second currents as well as instructions, utilized by the controller, for determining a leakage current of the direct current system signal based on the first and second currents.

In another embodiment, a fault detection apparatus for an electrically powered vehicle having a direct current power system with an inherent capacitance between the direct current power system and the vehicle's chassis is provided that includes a fault detection module connected to a chassis ground of the vehicle. The fault detection module is also connected to a first switch and a second switch, which are in turn connected to positive and negative nodes of the direct current power system respectively. The fault detection module includes a switch output driver control that sequentially or in an alternating manner opens and closes the first and second switches to charge and discharge the inherent capacitance at predetermined intervals. A current sensor senses a first current when the first switch is closed while the inherent capacitance is charged and senses a second current when the second switch is closed while the inherent capacitance is discharged. Based on the sensed values of the first and second currents, a digital controller, which may include a signal processor, utilizes preprogrammed instructions stored in a non-volatile memory to determine if a ground fault condition exists between the direct current power system and the vehicle's chassis. A data interface connected to the digital controller sends a signal, indicative of whether a fault condition is detected, to an on board computer or other controller or processor of the vehicle.

In yet another embodiment, a method of detecting a ground fault condition in a direct current power system of an electric vehicle or hybrid-electric vehicle, includes sequentially opening and closing a first switch connected between a positive node of the direct current power system and a chassis ground of the electric vehicle and a second switch connected between a negative node the of direct current power system and the chassis ground of the electric vehicle. As the first and second switches are opened and closed, an inherent capacitance between a metal or other conductive component of the power system and the chassis is charged and discharged. A first current through the first switch and a second current through the second switch are each measured as the inherent capacitance is charged and discharged. The measured values of the currents are used to determine if a ground fault condition exists between the direct current power system and the chassis ground.

BRIEF DESCRIPTION OF THE DRAWINGS

For a more complete understanding, reference is now made to the following description taken in conjunction with the accompanying Drawings in which.

DETAILED DESCRIPTION

Figure 1:
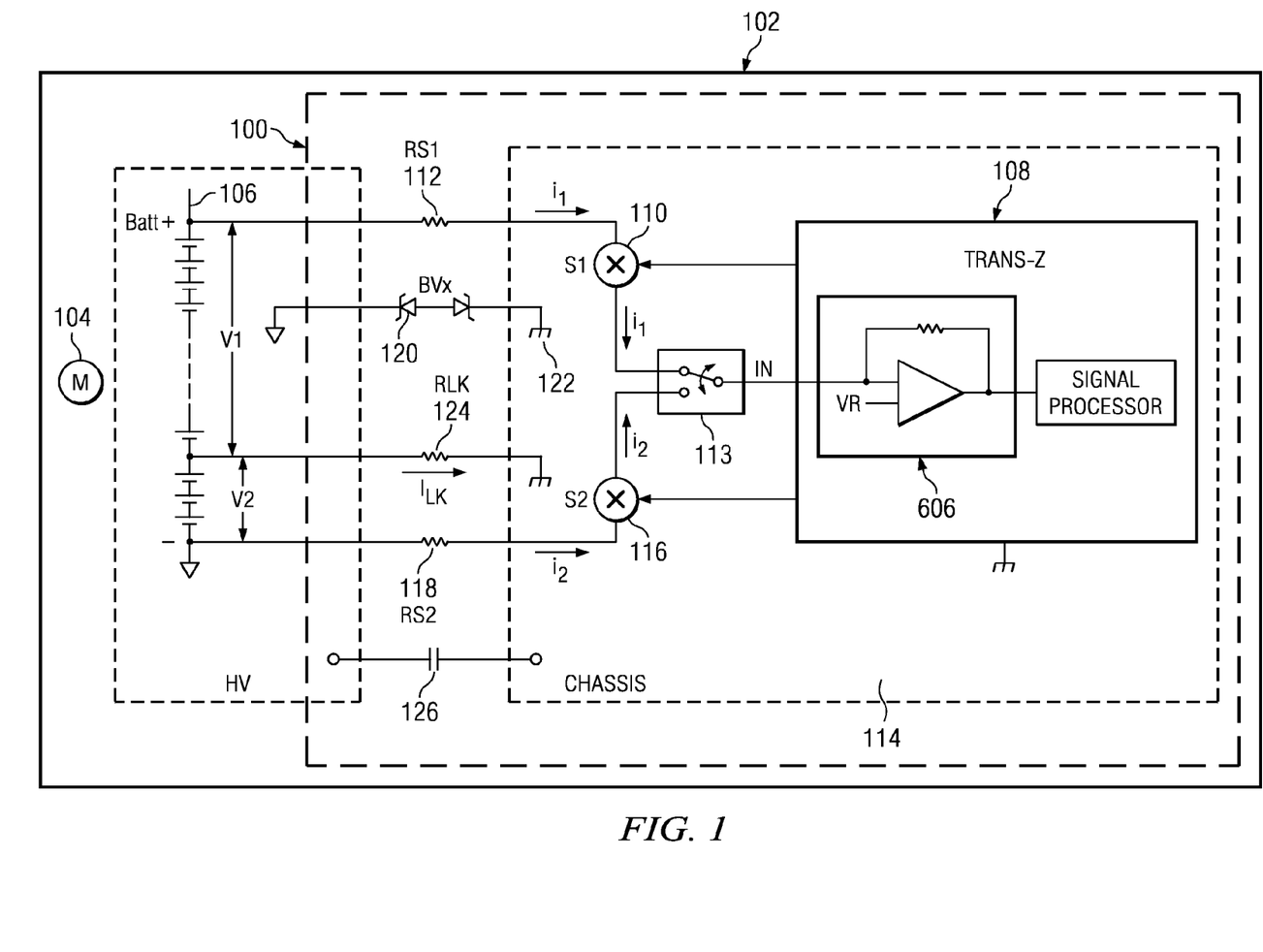
FIG. 1 illustrates a schematic representation of a high-voltage DC electrical system employing a fault detection system according to the disclosure.

FIG. 1 is a schematic representation of a high-voltage DC electrical system employing an exemplary fault detection system 100. For example, system 100 may be employed in an electrically-powered vehicle 102, such as a golf cart or automobile, driven by an electrical motor 104 and powered with a battery or battery pack 106. System 100 may also be employed in a gasoline-electric hybrid or other type of hybrid electric device or machine. Such systems typically operate at relatively high voltages, e.g., 100-1000 volts or higher. As illustrated, a detection module 108, which will be described in greater detail below, is connected to the positive terminal of battery 106 through a first switch 110 and a first resistor 112. Detection module 108 is also connected to the negative terminal of battery 106 through a second switch 116 and a second resistor 118. The first switch 110 and the second switch 116 may be combined as a single pole and double throw style switch or relay 113 as optionally shown.

In operation, switches 110 and 116 are sequentially opened and closed under the control of fault detection module 108. First and second switches 110, 116 are high-voltage, solid-state switches, for example, optically-coupled relays. First and second resistors 112, 118 are large-value resistors, typically on the order of 1 mega ohm or greater. Preferably, the resistance values of resistors 112, 118 are equal or substantially equal. In one embodiment, wherein the battery's ground and the chassis ground 122 are floating relevant to each other, the system 100 includes an over-voltage protection device that may include zener diodes 120. Other devices may be used to provide over-voltage protection for this system. As illustrated zener diodes 120 are connected between the chassis ground 122 and the high voltage system and have a breakdown voltage slightly greater than the potential across the direct current supply system, battery or battery pack 106.

In FIG. 1, parasitic resistance in the system is represented by resistor 124. Ideally, the value of resistance 124 is very large, on the order of mega ohms. Capacitor 126 represents the inherent capacitance in the system existing between the battery section 106 and the vehicle chassis ground 122. In the case of an electrically-powered vehicle, an inherent capacitance 126 is typically large due to the number and size of metal chassis components positioned near or adjacent to metal portions of the high-voltage system.

Figure 2:
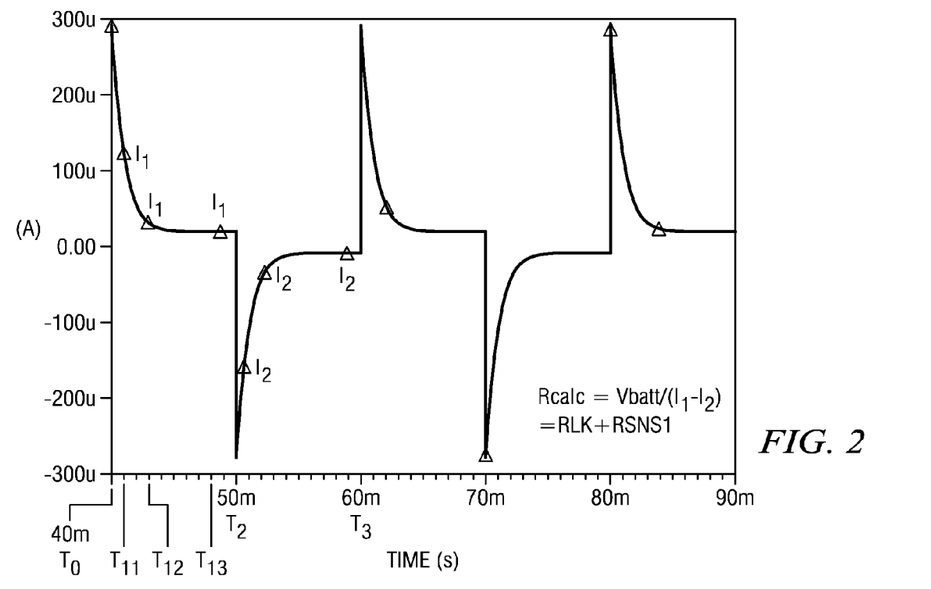
FIG. 2 is a graph illustrating the simulated operation of the fault detection system.

FIG. 2 is a graph illustrating the simulated operation of exemplary fault detection system 100. For the purpose of this example, the value of resistor 112 is assumed to be 1 mega ohm, the value of inherent capacitance 126 is assumed to be 1 nanofarad and the value of parasitic resistance 124 is assumed to be 10 mega ohms. This represents an ideal condition where there is little or no current leakage from the high voltage system to the chassis ground. As illustrated, when switch 110 is closed at time $T_0$, current flows through resistor 112 and switch 110 until the inherent capacitance 126 is charged. As inherent capacitance 126 is charged, the value of $I_1$ declines, approaching zero, reflecting the large value of resistor 112. At $T_2$, switch 110 is opened and switch 116 is closed. Inherent capacitance 126 is discharged through resistor 118 and switch 116 resulting in current flow $I_2$. As illustrated, as capacitance 126 is discharged, the value of $I_2$ approaches zero. As will be appreciated, FIG. 2 represents a system having a very high parasitic resistance and, consequently, a low leakage current designated as $I_{lk}$ in FIG. 1.

Figure 3:
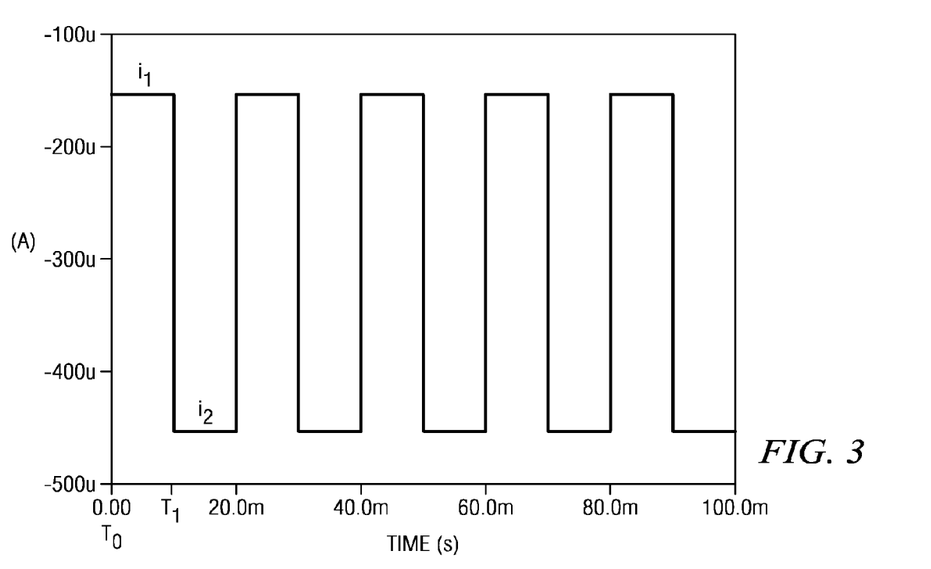
FIG. 3 is a graph illustrating the simulated operation of the fault detection system of FIG. 1 in the case of a fault.

FIG. 3 is a graph illustrating the simulated operation of the exemplary fault detection system 100 of FIG. 1 in the case of a fault. For the purposes of FIG. 3, a 300 volt battery system 106 is assumed with the values of resistors 112 and 118 set at 1 mega ohms and with the value of capacitance 126 being 1 nanofarad. In this case, a leakage current of 10 milliamps ($I_{lk}$) is also assumed. At $T_0$, switch 110 is closed. Current $I_1$ flows through the resistor 112 and switch 110. However, in this example the current flow $I_1$ does not decline due to leakage current flowing through parasitic resistance 124. At time $T_2$, switch 110 is opened and switch 116 is closed. Current $I_2$ flows through resistor 118 and switch 116. Again, the value of $I_2$ does not decline due to leakage $I_{lk}$ across parasitic resistance 124.

Figure 4:
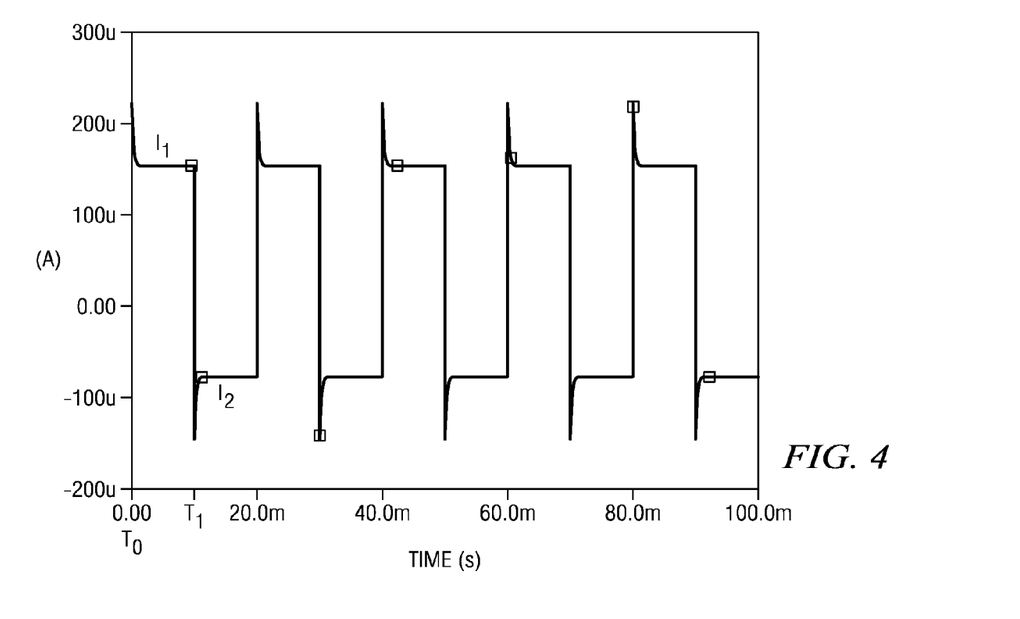
FIG. 4 is a graph representing the simulated operation of the fault detection system of FIG. 1 in a case of a second fault.

FIG. 4 is a graph representing the simulated operation of the fault detection system of FIG. 1 in a case where the value of parasitic resistance 124 is assumed to be 300 kilohms. Again, the values of resistors 112 and 118 are assumed to be 1 mega ohm and the value of inherent capacitance 126 is assumed to be 1 nanofarad. At $T_0$, switch 110 is closed and current flows through resistor 112 and the switch. As illustrated, the value of current $I_1$ declines rapidly, however, the value of $I_1$ does not approach zero due to leakage across parasitic resistance 124.

Figure 5:
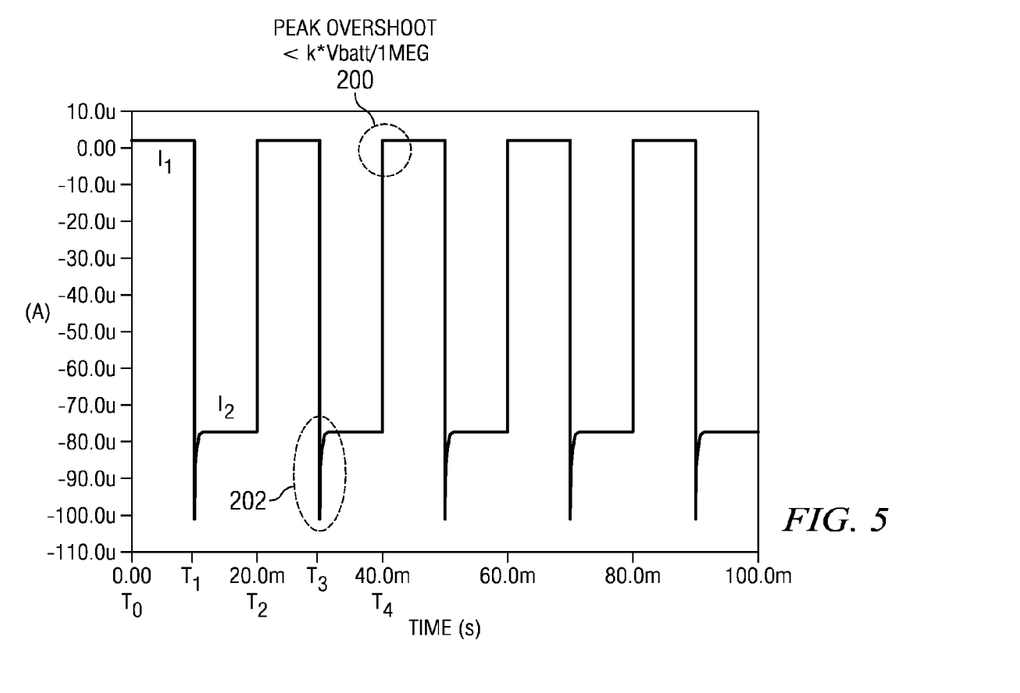
FIG. 5 is a graph further illustrating the simulated operation of the fault detection system of FIG. 1.

FIG. 5 is a graph illustrating the simulated operation of the fault detection system of FIG. 1 wherein resistor 112 has failed open. As in the case of FIG. 4, a 300 volt battery system 106 is assumed wherein the value of resistor 118 is 1 mega ohm and the value of parasitic resistance 124 is 300 kilohms with the value of inherent capacitance 126 being 1 nanofarad. At $T_0$, switch 110 is closed. However, because resistor 112 has failed open, no $I_1$ current flows through resistor 112. The lack of an $I_1$ current is indicative and can be measured as a failed open resistor 112. At time $T_1$, switch 116 is closed and switch 110 is opened. As is illustrated, current $I_2$ flows through switch 116 and resistor 118 peaking and then declining to a level reflecting the relatively low value of parasitic resistance 124. At time T2, switch 116 is opened and switch 110 is closed. However, the value of $I_1$ goes to zero because of the failure of resistor 112. Furthermore, the circled portion 200 identifies a further detectable and measurable indication that resistor 112 is failed open. The further indication of an open resistor 112 is seen, for example, at time T4 in the circled portion 200, wherein the overshoot 202 normally seen due to the occurrence of a capacitor/resistor charge or discharge, is not present. Thus, in some embodiments each leading or overshoot portion 200, 202 of the $I_1$, $I_2$ wave form can also be monitored or compared by the controller (as discussed below) in order to determine if there is a system resistor failure. In similar fashion, a failure of resistor 118 can also be monitored. In other words, multiple current measurements taken at different locations of the $I_1$, $I_2$ current wave form can be used to determine whether a ground fault occurs or whether the ground fault detection circuit or detection system has failed.

Figure 6:
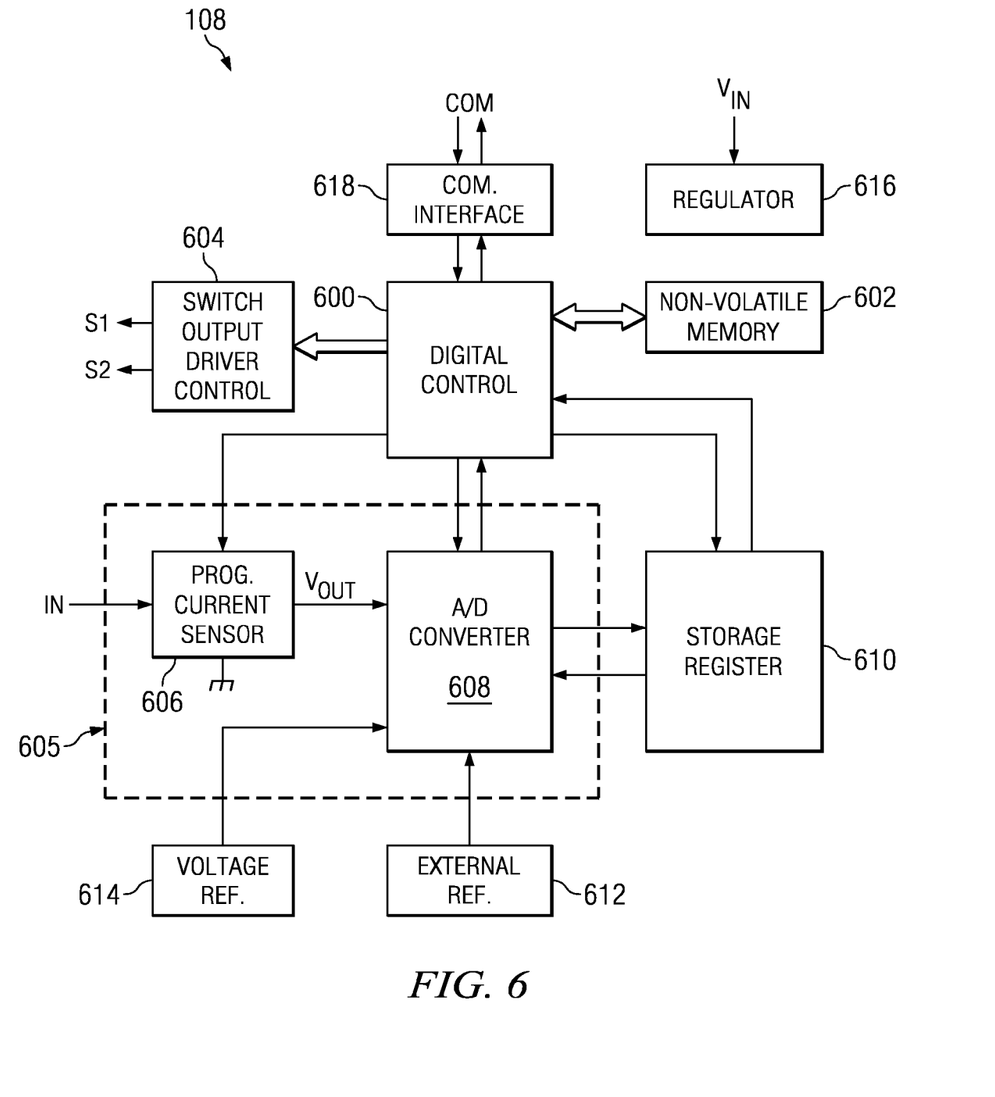
FIG. 6 is a block diagram illustrating one configuration of the fault detection module of FIG. 1.

FIG. 6 is a block diagram illustrating an exemplary configuration of fault detection module 108 of FIG. 1. As illustrated, module 108 includes a digital controller or a microprocessor 600 and an associated non-volatile memory 602. Non-volatile memory 602 may be programmed or provided with instructions for storage. The stored instructions are utilized by the operating module 108 for specific applications. For example, non-volatile memory 602 may be programmed with instructions dictating the frequency at which switches 110 and 116 are sequentially cycled, the frequency at which currents $I_1$ and $I_2$ are measured or sampled and threshold values for indicating a fault. As illustrated, microprocessor 600 controls the operation of switches 110 and 116 via a switch output driver control 604.

The values of $I_1$ and $I_2$ are measured using a current sensor circuit 605 that may include a transimpedance programmable gain amplifier or a programmable/adjustable current sensor 606. The transimpedance programmable amplifier 606 essentially represents a current measurement of an input (IN) as a voltage output ($V_{OUT}$). In other embodiments, other devices or circuits that provide an output signal that represents a measurement of a current flow or that performs essentially the same function may be used. Referring again to FIG. 2, values of $I_1$ and $I_2$ may be determined or measured at predetermined intervals. For example, the value of $I_1$ may be sampled one, two, three or more times between $T_0$ and $T_2$. Other sampling frequencies may be used.

The output of programmable gain amplifier 606 is received by an analog to digital converter 608, which converts the voltage output signal to a digital output. In one embodiment, the digital output is sampled at predetermined intervals under the control of microprocessor 600 and the samples are stored in storage registers 610. In some embodiments, selected stored values may be averaged in order to smooth the current measurements over a predetermined period of time and/or over a predetermined number of stored value samples. In various embodiments, the digital output of the current sensor circuit 605 or of the analog to digital converter 608 is provided directly, substantially directly or indirectly to the controller 600. Analog to digital converter 608 may be supplied with a reference voltage from one of an internal reference voltage circuit 614 or from an external reference voltage 612. Module 108 may be powered with the output of a voltage regulator circuit 616, which may be integral to the module 108 or may be a separate external device.

Module 108 also includes a data or communication interface 618 allowing microprocessor 600 to communicate with an external device. Various standard communication interfaces can be employed as the communications interface 618, including, but not limited to, I²C, CAN, SAA, one-wire or other communication interfaces including custom communication interfaces as well as analog signal interfaces. For example, in the case where fault detection system 100 is employed in an electrical vehicle, communications interface 618 may transmit a signal indicative of whether a fault is detected to a controller or computer system of the electrical vehicle. In one embodiment, microprocessor 600 may transmit a signal indicating the presence of a fault through interface 618 to an electric vehicle's computer or control system. In this variation, a number of actions may be taken. For example, an audible or visual alarm may be sounded or a relay may be opened when the vehicle is turned off and placed in "park" to disable the vehicle's electrical system. In other embodiments, the output of the signal from microprocessor 600 through communications interface 618 is utilized for diagnostic purposes with a test device.

By way of further illustration, measuring the values $I_1$ and $I_2$ enables the value of any parasitic resistance 124 to be determined. Turning again to FIG. 1, the value of parasitic resistance 124 may be determined as follows. When switch 112 is closed:

$$I_1 = ((V1 - VR))/(RS_1 + R_{lk})$$

Where $RS_1$ is the resistance of first resistor 112, $R_{lk}$ is the value of parasitic resistance 124 and V1 and VR are the indicated voltages in FIG. 1.

When switch 112 is opened and switch 116 closed:

$$I_2 = (V2 - VR)/(RS_2 + R_{lk})$$

Where $RS_2$ is the resistance of the second resistor 116.
Combining the currents and setting $RS_1 = RS_2$:

$$(I_1 - I_2) = (V1 - VR + (V2 + VR))/(RS_2 + R_{lk}) = VBATT/(RS_2 + R_{lk})$$

Where VBATT is the voltage of battery 106.

Since $I_1$ and $I_2$ are measured using the detection module 108 and VBATT and $RS_2$ are known quantities, the foregoing equation can be solved using the digital controller 600 and instruction from the non-volatile memory 602, for $R_{lk}$. With the value of $R_{lk}$ known, the leakage current $I_{lk}$ may be determined as $I_{lk} = VBATT/R_{lk}$. If the digital controller determines that $I_{lk}$ is greater than a predetermined value, such as 1 milliamp, the digital controller 600 will instruct the communication interface 618 to communicate a fault signal.

Referring again to FIG. 1, although system 100 is illustrated as being connected directly to the terminals of battery pack 106, in other versions it may be connected across different nodes of the high voltage system. In different embodiments, system 100 may be incorporated into high voltage battery packs for vehicles, utilized in battery powered backup power systems, cordless power tools or equipment and similar devices. Furthermore, the fault detection module 108 may be incorporated into the direct current power supply side or onto the chassis side of the vehicle, device, or machine.

Another embodiment of the invention may comprise a hand or user held high voltage ground fault tester that incorporates the module 108 and the switches 110 and 116, while having a three pronged lead connected thereto. One of the three leads could be made to contact a chassis or device ground, the second lead may incorporate a resistor RS1 112 and contact a high side of a high voltage DC power source, and the third lead may incorporate a resistor RS2 118 and contact a low or ground side of the high voltage DC power source. With such an exemplary hand held test device, ground faults comprising potentially deadly current to humans can be easily tested in electrically noisy high voltage electrical environments between electric or hybrid-electric machinery and high voltage DC power sources or AC power sources having an associated large DC offset voltage.

Although the preferred embodiment and other embodiments have been described in detail, it should be understood that various changes, substitutions and alterations can be made therein without departing from the concepts and scope of the invention.

What is claimed is:

1. An apparatus for monitoring a direct current system for ground faults in a device having an inherent capacitance between the direct current system and a chassis ground, the apparatus comprising:
a fault detection module;
a first switch connected between a positive node of the direct current system and the fault detection module;
a second switch connected between a negative node of the direct current system the fault detection module;
a switch driver that sequentially opens and closes the first switch and the second switch such that the inherent capacitance is charged and discharged;
wherein the fault detection module is connected between the chassis ground and the first and second switches, the fault detection module comprising:
a controller for controlling the switch driver;
a current sensor connected to the controller, the current sensor senses a first current when the first switch is closed and a second current when the second switch is closed, the current sensor provides current measurements, wherein the current measurements are signals indicative of the amperage of each of the first current and the second current; the current sensor comprises a programmable gain amplifier and an analog to digital signal converter, the programmable gain amplifier is adapted to transmit a signal to the analog to digital signal converter, and the analog to digital signal converter is adapted to transmit a current measurement to the controller; and
a data interface connected to the controller, the data interface outputs a signal in response to a result provided from a controller calculation, wherein the controller calculation comprises current measurements.

2. The apparatus of claim 1, further comprising a first resistor connected in series between the positive node of the direct current system and the first switch and a second resistor connected in series between the negative node of the direct current system and the second switch.

3. The apparatus of claim 2, wherein the resistances of the first resistor and second resistor are substantially equal.

4. The apparatus of claim 1, wherein the fault detection module is connected to the electrical system of an electrically powered or a hybrid-electrically powered vehicle.

5. An apparatus for monitoring a direct current system for ground faults in a device having an inherent capacitance between the direct current system and a chassis ground, the apparatus comprising:
a fault detection module;
a first switch connected between a positive node of the direct current system and the fault detection module;
a second switch connected between a negative node of the direct current system the fault detection module;
a switch driver that sequentially opens and closes the first switch and the second switch such that the inherent capacitance is charged and discharged;
wherein the fault detection module is connected between the chassis ground and the first and second switches, the fault detection module comprising:
a controller for controlling the switch driver;
a current sensor connected to the controller, the current sensor senses a first current when the first switch is closed and a second current when the second switch is closed, the current sensor provides current measurements, wherein the current measurements are signals indicative of the amperage of each of the first current and the second current;
a data interface connected to the controller, the data interface outputs a signal in response to a result provided from a controller calculation, wherein the controller calculation comprises current measurements; and
a non-volatile memory connected to the controller, the non-volatile memory adapted to be loaded with a plurality of instructions, wherein the plurality of instructions are configured to cause the controller to perform the controller calculation to determine whether a ground fault exists between the direct current system and the chassis ground and to provide the result, wherein the controller calculation comprises current measurements of the first current and second current.

6. An apparatus for monitoring a direct current system for ground faults in a device having an inherent capacitance between the direct current system and a chassis ground, the apparatus comprising:
a fault detection module;
a first switch connected between a positive node of the direct current system and the fault detection module;
a second switch connected between a negative node of the direct current system the fault detection module;
a switch driver that sequentially opens and closes the first switch and the second switch such that the inherent capacitance is charged and discharged;
wherein the fault detection module is connected between the chassis ground and the first and second switches, the fault detection module comprising:
a controller for controlling the switch driver;
a current sensor connected to the controller, the current sensor senses a first current when the first switch is closed and a second current when the second switch is closed, the current sensor provides current measurements, wherein the current measurements are signals indicative of the amperage of each of the first current and the second current;
a data interface connected to the controller, the data interface outputs a signal in response to a result provided from a controller calculation, wherein the controller calculation comprises current measurements; and
a non-volatile memory connected to the controller, the non-volatile memory adapted for storing a plurality of instructions, wherein the plurality of instruction are configured to cause the controller to perform the controller calculation to determine whether a parasitic resistance that can produce a parasitic current greater than a predetermined amperage exists between the direct current system and the chassis ground and to provide the result.

7. An apparatus for monitoring a direct current system for ground faults in a device having an inherent capacitance between the direct current system and a chassis ground, the apparatus comprising:
a fault detection module;
a first switch connected between a positive node of the direct current system and the fault detection module;

a second switch connected between a negative node of the direct current system the fault detection module;
a switch driver that sequentially opens and closes the first switch and the second switch such that the inherent capacitance is charged and discharged;
wherein the fault detection module is connected between the chassis ground and the first and second switches, the fault detection module comprising:
a controller for controlling the switch driver;
a current sensor connected to the controller, the current sensor senses a first current when the first switch is closed and a second current when the second switch is closed, the current sensor provides current measurements, wherein the current measurements are signals indicative of the amperage of each of the first current and the second current;
a data interface connected to the controller, the data interface outputs a signal in response to a result provided from a controller calculation, wherein the controller calculation comprises current measurements; and
a non-volatile memory connected to the controller, the non-volatile memory adapted for storing a plurality of instructions, wherein the plurality of instructions are configured to cause the controller to perform the controller calculation to determine whether a leakage current greater than a predetermined amperage exists between the direct current system and the chassis ground and to provide the result.

8. An apparatus for monitoring a direct current system for ground faults in a device having an inherent capacitance between the direct current system and a chassis ground, the apparatus comprising:
a fault detection module;
a first switch connected between a positive node of the direct current system and the fault detection module;
a second switch connected between a negative node of the direct current system the fault detection module;
a switch driver that sequentially opens and closes the first switch and the second switch such that the inherent capacitance is charged and discharged; and
an over-voltage protection device connected between the chassis ground and the negative node of the direct current system;
wherein the fault detection module is connected between the chassis ground and the first and second switches, the fault detection module comprising:
a controller for controlling the switch driver;
a current sensor connected to the controller, the current sensor senses a first current when the first switch is closed and a second current when the second switch is closed, the current sensor provides current measurements, wherein the current measurements are signals indicative of the amperage of each of the first current and the second current; and
a data interface connected to the controller, the data interface outputs a signal in response to a result provided from a controller calculation, wherein the controller calculation comprises current measurements.

9. An electrical fault detection apparatus for an electrically powered vehicle or a hybrid-electrically powered vehicle wherein the vehicle comprises a direct current power system and an inherent capacitance between the direct current power system and the vehicle's chassis, the apparatus comprising:
a fault detection module adapted for connection between a chassis ground of the vehicle and a first switch, the first switch connected to a positive node of the direct current power system, the fault detection module further adapted for connection between the chassis ground and a second switch, the second switch connected to a negative node of the direct current power system, the fault detection module comprising:
a switch output driver control that provides switching signals for receipt by the first and second switches, the switching signals instruct the first switch and the second switch to sequentially open and close and thereby charge and discharge the inherent capacitance at predetermined intervals;
a current sensor that senses a first current as the inherent capacitance is charged and a second current as the inherent capacitance is discharged;
a controller connected to the switch output driver control, the controller provides a switch output driver control signal to the switch output driver control;
a non-volatile memory connected to the controller, the non-volatile memory adapted for storing a plurality of instructions, wherein the plurality of instruction are configured to cause the controller to determine whether a fault condition exists based on digital measurement data output from the current sensor; and
a communication interface connected to the controller that outputs a signal for a vehicle controller in response to a fault condition signal from the controller.

10. The apparatus of claim 9, wherein the current sensor comprises:
a programmable gain amplifier that receives the first current and second current, and
an analog to digital signal converter that receives a programmable gain amplifier output signal that is indicative of first current and second current measurements, the analog to digital signal converter providing digital measurement data output either directly or indirectly to the controller.

11. The apparatus of claim 9, wherein a first resistor is connected in series between the positive node of the direct current system and the first switch and a second resistor is connected in series between the negative node of the direct current system and the second switch.

12. The apparatus of claim 11, wherein the resistances of the first resistor and the second resistors are substantially equal.

13. The apparatus of claim 9, wherein the plurality of instructions are further configured to cause the controller to include predetermined interval information in the switch output driver control signal.

14. The apparatus of claim 9, further comprising an over-voltage protection device connected between the chassis ground and the negative node of the direct current system.

15. The apparatus of claim 9, wherein the plurality of instructions are further configured to cause the controller to determine whether a leakage current between the direct current system and the chassis is greater than a predetermined amperage.

16. A method of detecting a fault condition in a direct current power system of an electric or hybrid-electric vehicle, the direct current power system having an inherent capacitance between metal components of the direct current power system and the vehicle's metal chassis, the method comprising:
sequentially opening and closing, using a digital controller, a first switch connected between a positive node of the direct current power system and a chassis ground and a second switch connected between a negative node of direct current power system and the chassis ground to charge and discharge the inherent capacitance at predetermined intervals;

measuring a value of a first current as the inherent capacitance is charged and a value of a second current as the inherent capacitance is discharged; and calculating, using the digital controller operating in accordance with a plurality of instructions stored in a nonvolatile memory, whether a ground fault condition exists in the vehicle using the measured values of the first current and second current.

17. The method of claim 16, further comprising providing a fault signal to a vehicle circuit when a fault condition is detected.

18. The method of claim 16, further comprising calculating, using the digital controller, a parasitic resistance between the direct current system and the chassis based on the amperage of the first and second currents.

19. The method of claim 16, further comprising determining a leakage current between the direct current system and the chassis using the measured values of the first current and the second current.

\* \* \* \* \*